United States Patent [19]

Urano et al.

[11] Patent Number: 5,627,006

[45] Date of Patent: May 6, 1997

[54] RESIST MATERIAL

[75] Inventors: Fumiyoshi Urano; Keiji Oono; Hirotoshi Fujie, all of Kawagoe, Japan

[73] Assignees: Wako Pure Chemical Industries, Ltd.; Matsushita Electric Industrial Co., Ltd., both of Osaka, Japan

[21] Appl. No.: 425,220

[22] Filed: Apr. 18, 1995

Related U.S. Application Data

[63] Continuation of Ser. No. 295,154, Aug. 24, 1994, abandoned, which is a continuation of Ser. No. 990,397, Dec. 11, 1992, abandoned.

[30] Foreign Application Priority Data

Dec. 16, 1991 [JP] Japan .................. 3-352755

[51] Int. Cl.$^6$ .................. G03F 7/023; G03F 7/004
[52] U.S. Cl. .................. 430/192; 430/170; 430/270.1; 430/326; 430/330; 430/920; 430/923; 430/924; 522/33; 522/36; 522/59
[58] Field of Search .................. 430/270.1, 905, 430/909, 170, 192, 920, 923, 924, 326, 330; 522/33, 36, 59

[56] References Cited

U.S. PATENT DOCUMENTS

| | | | |
|---|---|---|---|
| 4,101,323 | 7/1978 | Buhr et al. | 96/35 |
| 4,491,628 | 1/1985 | Ito et al. | 430/176 |
| 4,603,101 | 7/1986 | Crivello | 430/270 |
| 4,678,737 | 7/1987 | Schneller et al. | 430/270 |
| 4,828,958 | 5/1989 | Hayase et al. | 430/175 |
| 4,959,293 | 9/1990 | Schwartzkopf et al. | 430/189 |
| 5,198,322 | 3/1993 | Wilharm et al. | 430/192 |
| 5,225,316 | 7/1993 | Vogel et al. | 430/270 |
| 5,250,669 | 10/1993 | Ogawa et al. | 430/189 |
| 5,258,257 | 11/1993 | Sinta et al. | 430/270 |
| 5,468,589 | 11/1995 | Urano et al. | 430/170 |
| 5,558,971 | 9/1996 | Urano et al. | 430/170 |

FOREIGN PATENT DOCUMENTS

| | | |
|---|---|---|
| 0319325 | 6/1989 | European Pat. Off. . |
| 0417556 | 3/1991 | European Pat. Off. . |
| 0417557 | 3/1991 | European Pat. Off. . |
| 0440374 | 8/1991 | European Pat. Off. . |
| 0440376 | 8/1991 | European Pat. Off. . |
| 0520642 | 12/1992 | European Pat. Off. . |
| 2305757 | 10/1976 | France . |
| 3841571 | 6/1989 | Germany . |
| 4214363 | 11/1992 | Germany . |
| 1-154048 | 6/1989 | Japan . |
| 2-25850 | 1/1990 | Japan . |
| 2-62544 | 3/1990 | Japan . |
| 2-209977 | 8/1990 | Japan . |
| 3-282550 | 12/1991 | Japan . |
| 1231789 | 5/1971 | United Kingdom . |

OTHER PUBLICATIONS

IEEE Transactions on Electron Devices, Deep UV Photoresists I. Meldrum's Diazo Sensitizer vol. 28 No. 11, pp. 1300–1305.

Frechet et al., Novel derivatives of poly(4-hydroxystyrene) with easily removable tertiary, allyl, or benzylic ethers, Polymer Bulletin 20, pp. 427–434 (1988).

Stover et al., Acid catalyzed rearrangement of aromatic ethers: Model studies and application to imaging, Polymer Material Sci. Eng., 61, pp. 412–416, (1989).

Ito et al., Chemical amplification in the design of dry developing resist materials, Polymer Engineering and Science, vol. 23, No. 18, pp. 1012–1018, Dec. 1983.

Neenan et al., Chemically amplified resists: A lithographic comparison of Acid generating species, SPIE vol. 1086 Advances in Resist Technology and Processing VI, pp. 1–9 (1989).

Pawlowski et al, Chemically amplified DUV photoresists using a new class of photoacid generating compounds, SPIE vol. 1262 Advances in Resist Technology and Processing VII, pp. 8–15 (1990).

Murata et al., An aqueous base developable novel deep-UV resist for KrF eximer laser lithography, SPIE vol. 1262 Advances in Resist Technology and Processing VII, pp. 16–25 (1990).

Schelegel et al., Determination of acid diffusion in chemical amplification positive deep UV resists, J. Vac. Sci. Tech. B 9 (2), pp. 278–289. Mar./Apr. 1991.

Reichmanis et al., Chemistry and Processes for Deep-UV Resists, Microelectric Engineering, vol. 13, No. 1/4, pp. 3–10, Mar., 1991, Amsterdam NL.

Patent Abstracts of Japan, vol. 14, No. 415 (P-1102) 7 Sep. 1990 of JP-A-2 161 436 (Oki Electric Ind Co Ltd) 21 Jun. 1990.

Derwent Abstracts of JP 63-36602, Jul. 21, 1988.
Derwent Abstract of JP 64-80944, Mar. 27, 1989.
Derwent Abstract of JP 1-155338, Jun. 19, 1989.
Derwent Abstract of JP 1-155339, Jun. 19, 1989.
Derwent Abstract of JP 1-188852, Jul. 28, 1989.
Derwent Abstract of JP 2-12153, Jan. 17, 1990.
Derwent Abstract of EP 342,498, Nov. 23, 1989.

*Primary Examiner*—John S. Chu
*Attorney, Agent, or Firm*—Armstrong, Westerman, Hattori, McLeland, & Naughton

[57] ABSTRACT

A photoresist composition comprising (a) a difficultly alkali-soluble special resin, (b) a photo-sensitive compound capable of generating a carboxylic acid, and (c) a solvent, is effective for pattern formation using deep ultraviolet light, KrF excimer laser beams, etc.

14 Claims, 1 Drawing Sheet

5,627,006

RESIST MATERIAL

This application is a Continuation application of Ser. No 08/295,154 filed Aug. 24, 1994, now abandoned, which is a Continuation application of 07/990,397 filed on filed Dec. 11, 1992, now abandoned.

BACKGROUND OF THE INVENTION

This invention relates to a resist material used for production of semiconductor devices, etc. Particularly, the present invention relates to a resist material for forming a positive pattern using deep ultraviolet (DUV) light having a wavelength of 300 nm or less, such as KrF excimer laser beams having a wavelength of 248.4 nm, etc.

In recent years, the wavelength of light from the light source of an exposing apparatus used for micro-fabrication, in particular, photolithography has been shortened with an enhancement of the packing density of semiconductor devices. Now, employment of KrF excimer laser beams (248.4 nm) has come to be investigated. However, a resist material suitable for this wavelength has not yet been found.

For example, as resist materials used in the case of using a light source capable of oscillating KrF excimer laser beams or deep ultraviolet light, there have been developed dissolution-inhibiting type resist materials comprising a resin having high transmittance for light of 248.4 nm and a photosensitive compound having a diazodiketo group in the molecule (for example, Japanese Patent Unexamined Publication Nos. 1-80944, 1-54048, 1-155338, 1-155339 and 1-188852, and Y. Tani et al., SPIE's 1989 Sympo., 1086-03, etc.). However, these dissolution-inhibiting type resist materials, in common with one another, have a low sensitivity and hence cannot be used in the case of employment of deep ultraviolet light or KrF excimer laser beams which requires a highly sensitive resist material. On the other hand, for reduction of the exposure energy (enhancement of the sensitivity), there has been proposed recently a chemical amplified type resist material in which an acid generated by exposure to light is used as a catalyst [H. Ito et al., Polym. Eng. Sci., 23, 1012 (1983)]. On such chemical amplified type resist materials, various reports have been presented [for example, H. Ito et al., U.S. Pat. No. 4,491,628 (1985); J. V. Crivello, U.S. Pat. No. 4,603,101 (1986); W. R. Brunsvolt et al., SPIE's 1989 Sympo., 1086-40; T. Neeman et al., SPIE's 1989 Sympo., 1086-01; and Japanese Patent Unexamined Publication No. 62-115440 (U.S. Pat. No. 4,603,101)]. Such chemical amplified type resist materials, however, involve the following problems. When there is used in them a phenol ether type resin such as poly(4-tert-butoxycarbonyloxystyrene), poly(4-tert-butoxycarbonyloxy-α-methylstyrene), poly(4-tert-butoxystyrene), poly(4-tert-butoxy-α-methylstyrene) or the like, all of the chemical amplified type resist materials have poor thermal stability and are disadvantageous in that because of their low adhesive properties to a substrate, film peeling tends to occur during development, so that no satisfactory pattern can be obtained. When there is used a carboxylic acid ester type resin such as poly(tert-butyl 4-vinylbenzoate) or the like, the chemical amplified type resist materials are insufficient in light-transmitting properties near 248.4 nm because of the aromatic ring. When there is used a poly(tert-butyl methacrylate) or the like, the thermal stability and dry etching durability of this resin are poor. As resist materials free from the above defects, there have recently been reported a resist material obtained by use of a copolymer of p-tert-butoxycarbonyloxystyrene and p-hydroxystyrene (Japanese Patent Unexamined Publication No. 2-209977 (EP 366,590)), a resist material obtained by use of a copolymer of p-tetrahydropyranyloxystyrene and p-hydroxystyrene (Japanese Patent Unexamined Publication No. 2-19847 (U.S. Pat. No. 5,069,997, U.S. Pat. No. 5,118, 585)), a resist material obtained by use of a copolymer of p-tert-butoxystyrene and p-hydroxystyrene (Japanese Patent Unexamined Publication No. 2-62544), etc. However, when a pattern formation is carried out using such a resist material, there takes place a loss of critical dimension of pattern with a time delay between exposure and post-exposure bake (hereinafter referred to as "PEB"). Therefore, even if a pattern can be formed in a remarkably short time, a good pattern formation cannot be expected in a practical production wherein a considerable time is required from the light exposure to PEB. Thus, such resist materials are disadvantageous in that they are of little practical use. Further, the resist materials obtained by use of the above-mentioned polymers or copolymers are, in common with one another, disadvantageous in that the difference in dissolution rate for an alkali developer between light exposed areas and non-exposed areas of the resist material is small, resulting in making resolution ability insufficient.

In addition, acids generated by photosensitive compounds capable of generating an acid upon exposure to light (hereinafter abbreviated as "photoacid generators") which are used in conventional chemical amplified type resist materials, are strong acids such as Lewis acids and sulfonic acids. Therefore, the acids are neutralized even in an atmosphere containing a slight amount of a basic substance such as organic amines or ammonia which are generated in the production of a semiconductor device, so that chemical amplification is not sufficiently caused, resulting in, for example, the following problem: the dimensions of a pattern are changed, or no good profile of pattern can be obtained.

Thus, although the chemical amplified type resist materials have a higher sensitivity than do conventional resist materials, they involve problems of, for example, poor in thermal stability of resin, poor in adhesion strength to a substrate, insufficient in transmittance for light of near 248.4 nm, insufficient resolution, and the impossibility of attainment of a good profile of pattern, and change of the dimensions of a pattern with the lapse of time which are due to insufficient chemical amplification. Therefore, they are difficult to put to practical use. Accordingly, there is eagerly desired a practical highly sensitive resist material free from all of the above problems.

SUMMARY OF THE INVENTION

This invention was made in consideration of such conditions and is intended to provide a positive type resist material (photoresist composition) using a polymer which is highly pervious to deep ultraviolet light, KrF excimer laser beams, etc., is highly sensitive to exposure by means of a source of such light and irradiation with electron beams or X-rays, is very excellent in thermal stability and adhesion strength to a substrate, and permits sufficient chemical amplification, so that a good profile of pattern can be obtained without a change of the dimensions of the pattern with the lapse of time.

This invention provides a photoresist composition comprising (a) a difficultly alkali-soluble resin obtained by reacting isopropenyl alkyl ether, 2-alkoxy-1-butene, isopropenyl trimethylsilyl ether or isopropenyl benzyl ether with a resin having phenolic hydroxyl groups, (b) a photosensitive compound which generates a carboxylic acid upon exposure to light, and (c) a solvent capable of dissolving the components (a) and (b).

DESCRIPTION OF PREFERRED EMBODIMENTS

Figure 1A:
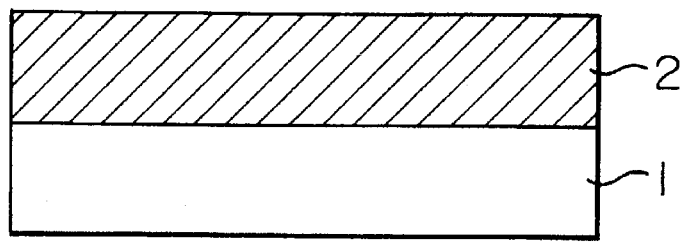
FIG. 1 is a flow diagram of a process for forming a positive pattern by use of the photoresist composition of this invention.

In order to achieve the above object, the present inventors earnestly investigated in search of a combination of a polymer and a photoacid generator which permits sufficient chemical amplification to give a good profile of pattern without a change of the dimensions of the pattern with the lapse of time. Consequently, the present inventors found that when a polymer obtained by reacting isopropenyl alkyl ether, 2-alkoxy-1-butene, isopropenyl trimethylsilyl ether or isopropenyl benzyl ether with a resin having phenolic hydroxyl groups is used as resin component (a) and a photosensitive compound capable of generating a carboxylic acid, a weak acid upon exposure to light is used as photoacid generator (b), said polymer releases a protecting group very easily to become soluble in an alkali developing solution, without any influence of basic substances such as organic amines and ammonia which are generated in the production of a semiconductor device, so that the above object can be achieved. Thus, this invention has been accomplished. There has not yet been reported a technique of utilizing a carboxylic acid, a weak acid, in a chemical amplified type resist material, and it is surprising that various problems which have heretofore taken place can be solved by use of a carboxylic acid.

Of polymers usable as the difficultly alkali-soluble resin (a) (hereinafter abbreviated as "the polymer"), polymers obtained by reacting isopropenyl alkyl ether, 2-alkoxy-1-butene, isopropenyl trimethyl-silyl ether or isopropenyl benzyl ether with a polyvinyl-phenol or a polyisopropenylphenol are represented by the formula:

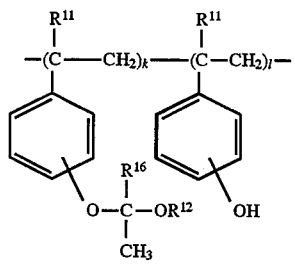

wherein $R^{11}$ is a hydrogen atom or a methyl group; $R^{16}$ is a methyl group or an ethyl group; $R^{12}$ is a linear, branched or cyclic alkyl group having 1 to 6 carbon atoms, a trimethyl-silyl group or a benzyl group; k and l are independently a natural number ($0.1 \leq k/(k+l) \leq 0.9$); and the position of each substituent is the m-position or the p-position. Polymers obtained by reacting isopropenyl alkyl ether, 2-alkoxy-1-butene, isopropenyl trimethyl-silyl ether or isopropenyl benzyl ether with a copolymer of vinylphenol and isopropenylphenol are represented by the formula:

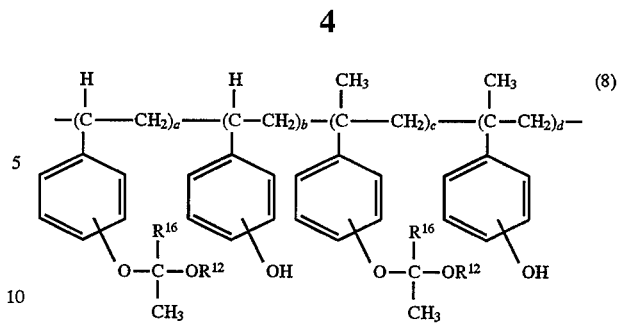

wherein $R^{12}$ and $R^{16}$ are as defined above; a, b, c and d are independently a natural number ($0.1 \leq a/(a+b) \leq 0.9$, $0.1 \leq c/(c+d) \leq 0.9$); and the position of each substituent is the m-position or the p-position.

In the formulae (7) and (8), as the linear, branched or cyclic alkyl group represented by $R^{12}$ there can be exemplified linear, branched or cyclic alkyl groups having 1 to 6 carbon atoms, such as methyl group, ethyl group, n-propyl group, isopropyl group, n-butyl group, tert-butyl group, isobutyl group, sec-butyl group, n-amyl group, isoamyl group, n-hexyl group, cyclohexyl group, cyclopentyl group, etc.

The polymer used in this invention has its most marked characteristic in that it comprises monomeric units formed by introduction into a styrene unit of a functional group of the formula:

wherein $R^{12}$ and $R^{16}$ are as defined above, which is very easily removable by the action of a carboxylic acid, that is, the polymer comprises monomeric units of the formula:

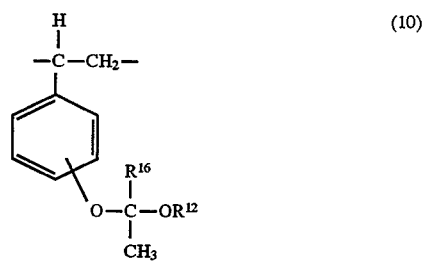

and/or the formula:

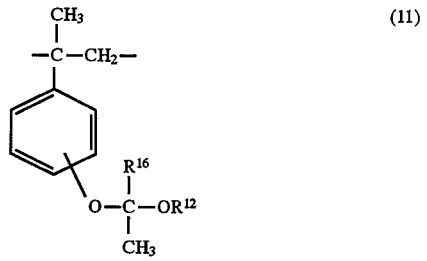

wherein $R^{12}$ and $R^{16}$ are as defined above.

In the polymer used in this invention, the ratio of the monomeric units of the formula (10) and/or the formula (11) to styrene units as monomeric units having no functional group introduced thereinto is usually 1:9 to 9:1. Although the polymer can be used in the photoresist composition of this invention when any ratio is employed in the above range, there is preferably employed a ratio of 2:8 to 7:3 which greatly improves the thermal stability of the polymer and the adhesion strength to a substrate.

Specific examples of the polymer used in this invention are p- or m-(1-methoxy-1-methylethoxy)-styrene/p- or m-hydroxystyrene polymers, p- or m-(1-methoxy-1-methylethoxy)-α-methylstyrene/p- or m-hydroxy-α-methylstyrene polymers, p- or m-(1-ethoxy-1-methylethoxy)styrene/p- or m-hydroxystyrene polymers, p- or m-(1-methoxy-1-methylpropoxy)styrene/p- or m-hydroxystyrene polymers, p- or m-(1-ethoxy-1-methylpropoxy)styrene/p- or m-hydroxystyrene polymers, p- or m-(1-isopropoxy-1-methylpropoxy)styrene/p- or m-hydroxystyrene polymers, p- or m-(1-ethoxy-1-methylethoxy)-α-methylstyrene/p- or m-hydroxy-α-methylstyrene polymers, p- or m-(1-n-propoxy-1-methylethoxy)styrene/p- or m-hydroxystyrene polymers, p- or m-(1-n-butoxy-1-methylethoxy)styrene/p- or m-hydroxystyrene polymers, p- or m-(1-isopropoxy-1-methylethoxy)styrene/p- or m-hydroxystyrene polymers, p- or m-(1-isobutoxy-1-methylethoxy)styrene/p- or m-hydroxystyrene polymers, p- or m-(1-tert-butoxy-1-methylethoxy)styrene/p- or m-hydroxystyrene polymers, p- or m-(1-n-pentoxy-1-methylethoxy)styrene/p- or m-hydroxystyrene polymers, p- or m-(1-isoamyloxy-1-methylethoxy)styrene/p- or m-hydroxystyrene polymers, p- or m-(1-n-hexyloxy-1-methylethoxy)styrene/p- or m-hydroxystyrene polymers, p- or m-(1-cyclohexyloxy-1-methylethoxy)styrene/p- or m-hydroxystyrene polymers, p- or m-(1-trimethylsilyloxy-1-methylethoxy)styrene/p- or m-hydroxystyrene polymers, p- or m-(1-trimethylsilyloxy-1-methylethoxy)-α-methylstyrene/p- or m-hydroxy-α-methylstyrene polymers, p- or m-(1-benzyloxy-1-methylethoxy)styrene/p- or m-hydroxystyrene polymers, p- or m-(1-benzyloxy-1-methylethoxy)-α-methylstyrene/p- or m-hydroxy-α-methylstyrene polymers, p- or m-(1-methoxy-1-methylethoxy)styrene/p- or m-hydroxystyrene/p- or m-(1-methoxy-1-methylethoxy)-α-methylstyrene/p- or m-hydroxy-α-methylstyrene polymers, p- or m-(1-trimethylsilyloxy-1-methylethoxy)styrene/p- or m-hydroxystyrene/p- or m-(1-trimethylsilyloxy-1-methylethoxy)-α-methylstyrene/p- or m-hydroxy-α-methylstyrene polymers, etc. Needless to say, the polymer used in this invention is not limited to them.

The polymer used in this invention can easily be obtained, for example, by the following method. As the resin having phenolic hydroxyl groups, there can be used (i) a poly(p-isopropenylphenol) obtained by radical polymerization of commercially available p-isopropenylphenol by a conventional method, (ii) a poly(p-hydroxy-α-methylstyrene/p-hydroxystyrene) obtained by radical polymerization of commercial p-isopropenylphenol and commercial p-tert-butoxyphenol by a conventional method, followed by reaction of the resulting polymer with heating in a suitable organic solvent in the presence of a strong acid such as hydrochloric acid or p-toluenesulfonic acid, or (iii) a poly(p-vinylphenol) obtained by radical polymerization of commercial p-tert-butoxystyrene by a conventional method, followed by reaction of the resulting polymer with heating in a suitable organic solvent in the presence of a strong acid such as hydrochloric acid or p-toluenesulfonic acid, or a commercial poly(p-vinylphenol). Isopropenyl alkyl ether, 2-alkoxy-1-butene, isopropenyl trimethylsilyl ether or isopropenyl benzyl ether is reacted with the resin in an amount of 0.1 to 2.5 moles per mole of the resin usually at 0° to 100° C., preferably 10° to 60° C., usually for 1 to 50 hours, preferably 1 to 30 hours, in an organic solvent such as 1,4-dioxane, acetone, tetrahydrofuran or methylene chloride in the presence of a slight amount of sulfuric acid, phosphoric acid, p-toluenesulfonic acid, thionyl chloride, phosphorus oxychloride, sulfuric anhydride or the like. Then, after-treatment is carried out by a conventional method, and the desired polymer is isolated.

The average molecular weight of the polymer used in this invention is not critical so long as the polymer can be utilized in the photoresist composition. Usually, the weight average molecular weight of the polymer is preferably about 1,000 to about 100,000, more preferably about 3,000 to about 40,000, as determined by a GPC method using a polystyrene as a standard. The number average molecular weight of the polymer is preferably about 2,000 to about 20,000.

As the photosensitive compound (b) capable of generating a carboxylic acid upon exposure to light which is used in this invention (hereinafter abbreviated as "the photoacid generator"), any photosensitive compound may be used so long as it generates a carboxylic acid upon exposure to light and has no undesirable influence on the profile of a photoresist pattern. As photoacid generators particularly preferable in this invention, there can be exemplified compounds having in the molecule one or more diazodiketo groups (—CO—C(=N$_2$)—CO—) or one or more diazoketo groups (—CO—C(=N$_2$)—) which are represented, for example, by the following formulae (1) to (6):

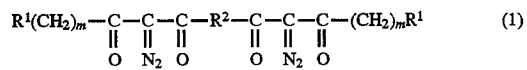   (1)

wherein $R^1$ is a hydrogen atom, a cycloalkyl group, a phenyl group, an alkyl-substituted phenyl group or an alkoxy-substituted phenyl group; $R^2$ is —(O)$_p$—$R^3$—(O)$_p$— [$R^3$ is

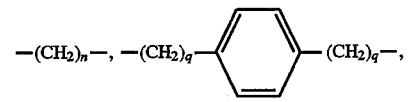

wherein n is an integer of 1 to 5; and q is zero or an integer of 1 to 5); and p is zero or 1; and m is an integer of 1 to 5.

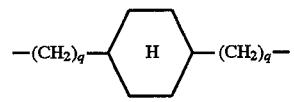   (2)

wherein $R^4$ and $R^{4'}$ are independently an alkyl group having 1 to 8 carbon atoms, or $R^5$—(CH$_2$)$_r$— ($R^5$ is a cycloalkyl group, a phenyl group, an alkyl-substituted phenyl group or an alkoxy-substituted phenyl group; $R^4$ and $R^{4'}$ may bind to each other to form a methylene chain; and r is zero or an integer of 1 to 5).

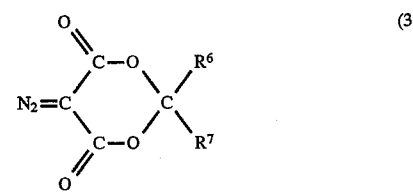   (3)

wherein $R^6$ and $R^7$ are independently an alkyl group having 1 to 10 carbon atoms, a benzyl group or a phenethyl group.

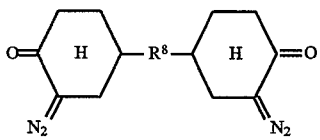

(4)

wherein $R^8$ is —C(CH$^3$)$_2$— or —(O—CO)$_z$—R$^9$—(CO—O)$_z$— [R$^9$ is —(CH$_2$)$_x$— (x is zero or an integer of 1 to 5) or —(CH$_2$)$_y$—R$^{10}$—(CH$_2$)$_y$—R$^{10}$ (R$^{10}$ is a phenylene group or a cyclohexylene group; and y is zero or an integer of 1 to 5); and z is zero or 1].

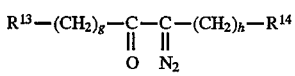

(5)

wherein $R^{13}$ and $R^{14}$ are independently a hydrogen atom, a phenyl group, an alkyl-substituted phenyl group or an alkoxy-substituted phenyl group; and g and h are independently an integer of 1 to 5.

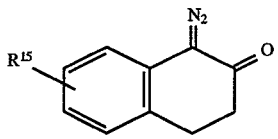

(6)

wherein $R^{15}$ is a hydrogen atom, an alkyl group or an alkoxy group.

Specific examples of the photoacid generator usable in this invention are 3,8-bis-diazo-2,4,7,9-decanetetraone, 1,4-bis(4-diazo-3,5-dioxohexyl)benzene, 1,2-bis(2-diazo-1,3-dioxobutoxy)ethane, bis(2-diazo-1,3-dioxobutoxy)methane, 1,4-bis(2-diazo-1,3-dioxobutoxy)-cyclohexane, 3-diazo-2,4-pentanedione, 3-diazo-1-phenyl-2,4-pentanedione, 4-diazo-1,7-diphenyl-3,5-heptanedione, 1,7-bis(p-tolyl)-4-diazo-3,5-heptanedione, 3-diazo-1,5-dicyclohexyl-2,4-pentanedione, 1-diazo-2,6-dioxocyclohexane, 5-diazo-2,2-dimethyl-1,3-dioxan-4,6-dione, 5-diazo-2-ethyl-2-methyl-1,3-dioxan-4,6-dione, 5-diazo-2-methyl-2-(2-phenethyl)-1,3-dioxan-4,6-dione, 5-diazo-2,2-dibenzyl-1,3-dioxan-4,6-dione, 2,2-bis(3-diazo-4-oxocyclohexyl)propane, di(3-diazo-4-oxocyclohexyl) 1,4-cyclohexanedicarboxylate, di(3-diazo-4-oxocyclohexyl) malonate, 1-diazo-2-tetralone, 1-diazo-5-methoxy-2-tetralone, 3-diazo-4-phenyl-2-butanone, 3-diazo-4-(4-tolyl)-2-butanone, 3-diazo-4-(4-methoxyphenyl)-2-butanone, 3-diazo-4-(3-tolyl)-2-butanone, 2-diazo-1,5-diphenyl-3-pentanone, 1,5-bis(4-tolyl)-2-diazo-3-pentanone, 1,5-bis(4-methoxyphenyl)-2-diazo-3-pentanone, etc. Needless to say, the photoacid generator used in this invention is not limited to them.

As the solvent (c) used in this invention, any solvent may be used so long as it can dissolve both the polymer used in this invention and the photoacid generator used in this invention. Usually, there are preferably used solvents which cannot absorb light at about 200 to 300 nm.

Specific examples of the solvent are methyl Cellosolve acetate, ethyl Cellosolve acetate, propylene glycol monomethyl ether acetate, methyl lactate, ethyl lactate, 2-ethoxyethyl acetate, methyl pyruvate, ethyl pyruvate, methyl 3-methoxypropionate, ethyl 3-methoxypropionate, N-methyl-2-pyrrolidone, cyclohexanone, 2-hexanone, methyl ethyl ketone, 1,4-dioxane, ethylene glycol monoisopropyl ether, diethylene glycol monomethyl ether, diethylene glycol dimethyl ether, etc. Needless to say, the solvent is not limited to them.

As to the blending proportions of the polymer used in this invention and the photoacid generator used in this invention in a positive type resist material, the proportion of the photoacid generator is 0.01 to 0.5 part by weight, preferably about 0.03 to about 0.3 part by weight, per part by weight of the polymer. The amount of the solvent in the photoresist composition of this invention is not critical so long as it does not cause a trouble when a positive type resist material obtained by dissolving the polymer used in this invention and the photoacid generator used in this invention in the solvent is coated on a substrate. The amount is usually 1 to 20 parts by weight, preferably about 1.5 to about 6 parts by weight, per part by weight of the polymer.

Although the photoresist composition of this invention usually comprises as main constituents the three components, i.e., the polymer (a), the photoacid generator (b) and the solvent (c), it may, if necessary, contain dyes, surfactants, etc.

As a developing solution used for forming a pattern by use of the photoresist composition of this invention, an alkali solution having a suitable concentration which dissolves the exposed area but hardly dissolves the unexposed area, is chosen depending on the solubility of the polymer used in this invention in alkali developing solutions. The concentration is chosen usually in the range of 0.01 to 20%. As the alkali solution used, there can be exemplified solutions containing organic amines such as tetramethylammonium hydroxide (TMAH), choline, triethanolamine, etc., or inorganic alkalis such as NaOH, KOH, etc.

A pattern is formed by use of the photoresist composition of this invention, for example, as follows.

The photoresist composition comprising the compounds according to this invention is coated on a substrate such as silicon wafer to a thickness of approximately 0.5–2 μm (approximately 0.1–0.5 μm when used as a top layer among three layers), and pre-baked in an oven at 70° to 130° C. for 10 to 30 minutes, or on a hot plate at 70° to 130° C. for 1 to 2 minutes. Then, a mask for forming a desired pattern is put over the resist film thus formed, and the resist film is exposed to actinic light, preferably deep ultraviolet light having a wavelength of 300 nm or less, at an exposure dose of approximately 1–100 mJ/cm$^2$, followed by baking at 70° to 150° C. for 0.5 to 2 minutes on a hot plate. Subsequently, using a developing solution such as an alkali solution, e.g. 0.1 to 5% aqueous tetramethylammonium hydroxide (TMAH) solution, the resist film is developed for about 0.5 to about 3 minutes by a conventional method such as a dip method, a puddle method or a spray method to form the desired positive pattern on the substrate.

As described above, since the polymer used in this invention has functional groups of the formula (9), it is much more difficultly soluble in alkali developing solutions but releases the functional groups more specifically and easily in the presence of a carboxylic acid generated by exposure to light, to become alkali-soluble, as compared with conventional polymers used for the same purpose. Therefore, the difference in dissolution rate for an alkali developing solution between light exposed areas and non-exposed areas of the photoresist composition can be made very remarkable, so that a high resolution ability can be attained. Furthermore, since the polymer used in this invention comprises hydroxystyrene units in addition to monomeric units formed by introduction of the aforesaid functional group into a styrene unit, it is excellent in thermal stability, dry etching durability and adhesion strength to a substrate.

In contrast to heretofore reported photoacid generators which generate a strong acid upon exposure to light, or the like and are disadvantageous in that owing to the strong acid, pattern formation tends to be influenced even in an atmosphere containing a slight amount of an amine or the like, the photoacid generators of the formula (1), (2), (3), (4), (5) or (6) according to this invention generate a carboxylic acid, a weak acid and hence are advantageous in that pattern formation is not influenced at all, so that the dimensions of a pattern can be stabilized without a change of the dimensions with the lapse of time. Furthermore, the photoacid generators according to this invention have in the molecule one or more diazo groups bleachable by exposure to light, or the like, they have a great advantage in that there can be reduced the influence of standing waves which has become marked with a shorter wavelength.

It was confirmed that in the photoresist composition of this invention, a carboxylic acid is generated not only by exposure to KrF excimer laser beams but also by exposure to electron beams or X-rays, and causes chemical amplification. Therefore, the photo-resist composition of this invention makes it possible to form a pattern by exposure to deep ultraviolet light, KrF excimer laser beams (248.4 nm), electron beams or X-rays at a low exposure dose by utilizing a chemical amplification method.

The action of this invention is explained below by giving specific examples. First, in an area exposed to KrF excimer laser beams, deep ultraviolet light or the like, an acid is generated, for example, by a photoreaction represented by Equation 1 or Equation 2 (in the case of the photoacid generators of the formula (1), (2) or (3), an acid is generated by a photoreaction represented by Equation 1, and in the case of the photoacid generators of the formula (4), (5) or (6), an acid is generated by a photo-reaction represented by Equation 2).

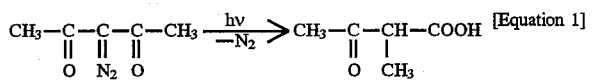

[Equation 1]

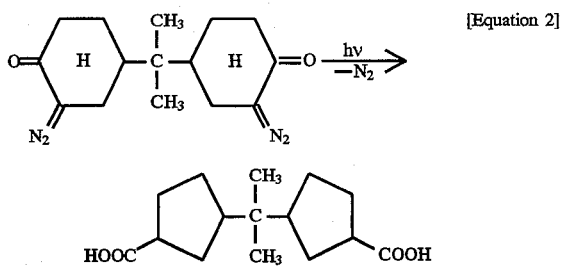

[Equation 2]

When PEB is carried out after the exposure, the specified functional group (for example, 1-methoxy-1-methylethoxy group as in the Equation 3 shown below) of the polymer used in this invention is chemically changed by the carboxylic acid to become a phenolic hydroxyl group, according to the following reaction formula, the Equation 3, and the polymer thus made alkali-soluble is dissolved in a developing solution during development:

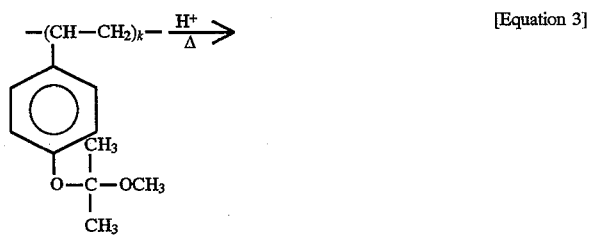

[Equation 3]

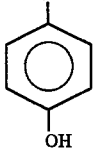

-continued

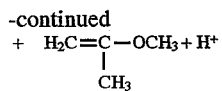

On the other hand, in the unexposed area, no acid is generated, so that PEB does not cause the chemical change. Moreover, the photoacid generator has the effect of protecting the hydrophilic group portion of the polymer used for improvement of the adhesion strength to a substrate, against infiltration with an alkali developing solution. Thus, when a pattern is formed using the photoresist composition of this invention, there is a large difference between the exposed area and the unexposed area in solubility in the alkali developing solution. Furthermore, since the polymer in the unexposed area has a strong adhesion to a substrate, no film peeling is caused during the development. Consequently, a positive pattern having a satisfactory contrast is formed. Since the acid generated by the exposure acts catalytically as shown in the above Equation 3, it is sufficient that the exposure is carried out so as to generate a necessary amount of the acid. Therefore, it becomes possible to reduce the exposure energy.

This invention is explained below in further detail with reference to Synthesis Examples, Examples and Comparative Examples, which are not by way of limitation but by way of illustration.

SYNTHESIS EXAMPLE 1

Synthesis of poly[p-(1-methoxy-1-methylethoxy)-styrene/p-hydroxystyrene]

(1) Free radical polymerization of p-tert-butoxystyrene

A solution of p-tert-butoxystyrene (17.6 g) in toluene containing catalytic amount of 2,2'-azobisisobutyronitrile (AIBN) was heated at 80° C. for 6 hours under nitrogen. After cooling, the reaction mixture was poured into methanol (1 l) and the polymer was precipitated. The polymer was filtered, washed with methanol and dried under reduced pressure to afford 15.5 g of poly(p-tert-butoxystyrene) as a white powder having Mw ca. 10000 and Mn ca. 5500 (GPC with polystyrene calibration)

(2) Synthesis of poly(p-hydroxystyrene)

A solution of poly(p-tert-butoxystyrene) (15.0 g) obtained in above (1) and conc. hydrochloric acid (10 ml) in 1,4-dioxane was refluxed for 4 hours with stirring. The mixture was cooled, poured into $H_2O$ (1 l) and the solid was precipitated. The polymer was filtered, washed with $H_2O$ and dried under reduced pressure to give 9.7 g of poly(p-hydroxystyrene) as a white powder.

(3) Synthesis of poly[p-(1-methoxy-1-methylethoxy)-styrene/p-hydroxystyrene]

To a solution of poly(p-hydroxystyrene) (4.0 g) obtained in above (2) and 2-methoxy-1-propene (4.8 g) in a mixed solvent (35 ml) of 1,4-dioxane and pyridine, a catalytic amount of p-toluenesulfonic acid was added and reacted with stirring at room temperature for 20 hours. After reaction, the reaction mixture was poured into $H_2O$ (1 l) and a white solid was precipitated. The polymer was filtered, washed with $H_2O$ and dried under reduced pressure to afford 4.1 g of the title compound as a white powder having Mw ca. 10000 (GPC with polystyrene calibration). The polymer was found to have P-(1-methoxy-1-methylethoxy) styrene unit and p-hydroxystyrene unit in a molar ratio of ca. 1:1 based on $^1$HNMR.

SYNTHESIS EXAMPLE 2

Synthesis of poly[p-(1-methoxy-1-methylethoxy)-styrene/p-hydroxystyrene]

To a solution of poly(p-hydroxystyrene) (4.0 g) obtained in Synthesis Example 1, (2) and 2-methoxy-1-propene (3.6 g) in 1,4-dioxane (35 ml), a catalytic amount of phosphorous oxychloride was added and reacted with stirring for 20 hours at room temperature. After reaction, the reaction mixture was poured into $H_2O$ (1 l) and white solid was precipitated. The polymer was filtered, washed with $H_2O$ and dried under reduced pressure to afford 4.0 g of the desired product as a white powder having Mw ca. 9000 (GPC with polystyrene calibration). The polymer was found to have p-(1-methoxy-1methylethoxy)styrene unit and p-hydroxystyrene unit in a molar ratio of ca. 4:6 based on $^1$HNMR.

SYNTHESIS EXAMPLE 3

Synthesis of poly[p-(1-ethoxy-1-methylethoxy)-styrene/p-hydroxystyrene]

(1) Synthesis of 2-ethoxy-1-propene

A mixture of succinic anhydride (24.0 g) and pyridine (19.0 g) was heated to 70 ° C. 2,2-Diethoxy-propane (26.4 g) was added dropwise to this at 70 ° C. and the mixture was refluxed for 2 hours at 80° C. with stirring. After reaction, the reaction mixture was distilled to afford 2-ethoxy-1-propene as a colorless oil having a boiling point of 62°–66° C.

$^1$HNMR δppm(CDCl$_3$): 1.30(3H, t, J=7 Hz, CH$_3$), 1.82(3H, s, CH$_3$), 3.71(2H, q, J=7 Hz, CH$_2$), 3.82(2H, d, J=3 Hz, =CH$_2$).

(2) Synthesis of poly[p-(1-ethoxy-1-methylethoxy)-styrene/p-hydroxystyrene]

Using poly(p-hydroxystyrene) (4.0 g) obtained in the same manner as described in Synthesis Example 1, (2), and 2-ethoxy-1-propene (2.5 g) obtained in above (1), the reaction and treatment were carried out in the same manner as described in Synthesis Example 2, to give 3.8 g of the desired product as a white powder having Mw ca. 11000 (GPC with polystyrene calibration). The polymer was found to have p-(1-ethoxy-1-methylethoxy)-styrene unit and p-hydroxystyrene unit in a molar ratio of ca. 35:65 based on $^1$HNMR.

SYNTHESIS EXAMPLE 4

Synthesis of poly[p-(1-methoxy-1-methylpropoxy)-styrene/p-hydroxystyrene]

(1) Synthesis of 2-methoxy-1-butene

To a solution of methylethylketone (54.1 g) and methyl orthoformate (58.6 g) in methanol (50 ml), a catalytic amount of p-toluenesulfonic acid was added and reacted for 5 days at room temperature. The reaction mixture was alkalified by sodium methoxide (28% in methanol), concentrated and the residue was distilled to give 68 g of methylethylketone dimethylacetal (bp. 105°–108° C.) as a colorless oil. Then, methylethylketone dimethylacetal (67 g) and a small amount of p-toluene-sulfonic acid was heated with stirring and distilled. The distillate was washed with dilute potassium hydroxide aqueous solution, dried over anhydrous MgSO$_4$ and distilled to give 19.4 g of 2-methoxy-1-butene as a colorless oil having a boiling point of 67°–68° C.

$^1$HMNR δppm(CDCl$_3$): 1.05(3H, t, CH$_3$), 2.05(2H, q, CH$_2$), 3.45(3H, s, CH$_3$ O), 3.70(2H, d, J=7 Hz, =CH2).

(2) Synthesis of poly[p-(1-methoxy-1-methylpropoxy)-styrene/p-hydroxystyrene]

Using poly(p-hydroxystyrene) (4.0 g) [MARUKA LYNCUR-M, manufactured by Maruzen Petrochemical Co., Ltd.: Mw ca. 20000] and 2-methoxy-1-butene (2.8 g) obtained in above (1), the reaction and treatment were carried out in the same manner as described in Synthesis Example 2, to give 4.0 g of the desired product as a slightly yellow powder. The polymer was found to have p-(1-methoxy-1-methylpropoxy) styrene unit and p-hydroxystyrene unit in a molar ratio of ca. 4:6 based on $^1$HNMR.

SYNTHESIS EXAMPLE 5

Synthesis of poly[p-(1-benzyloxy-1-methylethoxy)-styrene/p-hydroxystyrene]

Using poly(p-hydroxystyrene) (4.0 g) [available from Maruzen Petrochemical Co., Ltd.: Mw ca. 20000] and benzylisopropenylether (4.2 g) [purchased from Tokyo Chemical Industry Co., Ltd.], the reaction and treatment were carried out in the same manner as described in Synthesis Example 2, to give 4.1 g of the desired product as a slightly yellow powder. The polymer was found to have p-(1-benzyloxy-1-methylethoxy)styrene unit and p-hydroxystyrene unit in a molar ratio of 4:6 based on $^1$HNMR.

SYNTHESIS EXAMPLE 6

Synthesis of poly[p-(1-trimethylsilyloxy-1-methylethoxy)styrene/p-hydroxystyrene]

Using poly(p-hydroxystyrene) (4.0 g) [available from Maruzen Petrochemical Co., Ltd., Mw ca. 20000] and isopropenyltrimethylsilylether (3.7 g) [purchased from the Aldrich Chemical Co., Inc.], the reaction and treatment were carried out in the same manner as described in Synthesis Example 2, to afford 3.8 g of the desired product as a slightly yellow powder. The polymer was found to have p-(1-trimethylsilyloxy-1-methylethoxy)styrene unit and p-hydroxystyrene unit in a molar ratio of ca. 3:7 based on $^1$HNMR.

SYNTHESIS EXAMPLE 7

Synthesis of 3,8-bis-diazo-2,4,7,9-decanetetraone (1) Synthesis of p-toluenesulfonylazide After dissolving sodium azide (22.5 g, 0.35 mole) in a small amount of $H_2O$, the resulting solution was diluted with a 90% ethanol aqueous solution (130 ml). To this, a solution of p-toluenesulfonyl chloride (60 g, 0.32 mole) in ethanol (300 ml) was added dropwise at 10°–25° C., followed by reaction at room temperature for 2.5 hours. The reaction solution was concentrated at room temperature under reduced pressure. The resulting oily residue was washed several times with $H_2O$ and dried over anhydrous MgSO$_4$. After removing the drying agent by filtration, there was obtained 50.7 g of p-toluenesulfonylazide as a colorless oil.

$^1$HNMR δppm(CDCl$_3$): 2.43(3H, s, CH$_3$), 7.24(2H, d, J=8 Hz, Aromatic 3-H, 5-H), 7.67(2H, d, J=8 Hz, Aromatic 2-H, 6-H).

IR(Neat) νcm$^{-1}$: 2120 (—N3)

(2) Synthesis of 2,4,7,9-decanetetraone

To a suspension of sodium hydride (60% in oil, 16 g) in dry tetrahydrofuran (200 ml), a solution of 2,4-pentanedione (37.5 g) in dry tetrahydrofuran (100 ml) was added dropwise at −5~0° C. with stirring under nitrogen, and the resultant mixture was stirred for 20 min. at the same temperature. To this suspension, n-butyllithium (1.6M in n-hexane solution, 250 ml) was added dropwise at −5~0° C., followed by the addition of cuprous chloride (5.63 g) at −10° C. or lower and the resultant mixture was stirred for 45 min. at −5~0° C. Then to this suspension, a solution of iodine (47.6 g) in ethyl ether (250 ml) was added dropwise at −5~0° C., stirring was continued for 7 hours at room temperature and allowed to stand overnight. The reaction mixture was poured into dilute hydrochloric acid, extracted with ethyl acetate (200 ml×3), the organic layer was separated, washed with $H_2O$ (200 ml×3), dried over anhydrous $MgSO_4$ and evaporated. The residue was chromatographed on silica gel (Wakogel C-200, purchased from Wako Pure Chemical Industries, Ltd.) with methylene chloride as eluent and recrystallized from cyclohexane to afford 8.2 g of 2,4,7,9-decanetetraone as yellow leaflets having a melting point of 62.7°–64° C. The product was found to have keto-form and enol-form in a molar ratio of ca. 1:1 based on $^1$HNMR.

$^1$HNMR δppm($CDCl_3$): 2.02(6H, s, $CH_3$×2), 2.67(4H, s, $CH_2$ ×2), 3.64(2H, s, $CH_2$), 5.53(2H, s, OH and =CH—).

IR(KBr-disk) vcm$^{-1}$: 1630(C=O).

(3) Synthesis of 3,8-bis-diazo-2,4,7,9-decanetetraone

To a solution of 2,4,7,9-decanetetraone (7.9 g) obtained in above (2), and piperidine (6.9 g) in chloroform (200 ml), a solution of p-toluenesulfonylazide (15.8 g) obtained in above (1) in chloroform (50 ml) was added dropwise at 30°–35° C., and stirring was continued for 2 hours at the same temperature. After reaction, the mixture was concentrated, the residue was chromatographed on silica gel (Wakogel C-200) with methylene chloride/ethyl acetate[4/1 (v/v)] as eluent to give 2.5 g of the desired product as yellow crystals having a melting point of 79°–82.5° C.

$^1$HNMR δppm($CDCl_3$): 2.41(6H, s, $CH_3$×2), 3.11(4H, s, $CH_2$×2).

IR(KBr-disk) vcm$^{-1}$: 2110 ($CN_2$), 1640 (C=0).

UV(MeCN)$\lambda_{max}$ (ε): 229.9 nm (35400).

Anal. calcd. for $C_{10} H_{10} N_4 O_4$: c%, 48.00: H%, 4.03: N%, 22.39.

Found: C%, 48.30: H%, 3.97: N%, 22.33.

SYNTHESIS EXAMPLE 8

Synthesis of 3-diazo-1-phenyl-2,4-pentanedione (1) Synthesis of 1-phenyl-2,4-pentanedione Sodium (28 g) was added in small portions to a solution of ethyl phenylacetate (600 g, 3.66 moles) and acetone (70.7 g, 1.22 moles) under nitrogen, was dissolved at 30°–40° C. with stirring for 1 hour and then the mixture was reacted at 70°–80° C. for 4.5 hours. The reaction mixture was taken up in $H_2O$ (1.2 l), neutralized with dilute hydrochloric acid and extracted with chloroform. The organic layer was washed with $H_2O$, dried over anhydrous $MgSO_4$ and then evaporated. The residue was distilled under reduced pressure to give 53.2 g of the desired product as a colorless oil having a boiling point of 142°–146° C./15 mmHg. [Lit.: bp. 133°–136° C./10 mmHg; K. G. Hampton, T. M. Harris, C. R. Hauser, Org. Synth., 51., 128 (1971).]

(2) Synthesis of 3-diazo-1-phenyl-2,4-pentanedione

To a solution of 1-phenyl-2,4-pentanedione (36.2 g, 0.21 mole) obtained in above (1) and piperidine (17.5 g, 0.21 mole) in methylene chloride (500 ml), p-toluenesulfonylazide (44.5 g, 0.23 mole) obtained in the same manner as described in Synthesis Example 7, (1) was added dropwise at 0°–5° C., and stirring was continued for 1 hour at the same temperature. The reaction mixture was washed with dilute potassium hydroxide aqueous solution and $H_2O$, dried over anhydrous $MgSO_4$ and evaporated in vacuo. The resultant residue (50 g) was chromatographed on silica gel (Wakogel C-200, purchased from Wako Pure Chemical Industries, Ltd.) with n-hexane/ethyl acetate [10/1(v/v)] as eluent to give 33.0 g of the desired product as a orange-red viscous oil.

$^1$HNMR δppm($CDCl_3$): 2.36(3H, s, $CH_3$), 4.00(2H, s, $CH_2$), 7.23(5H, s, Aromatic).

IR(Neat) vcm$^{-1}$: 2140($CN_2$), 1660(C=O)

SYNTHESIS EXAMPLE 9

Synthesis of 4-diazo-1,7-diphenyl-3,5-heptanedione (1) Synthesis of 1,7-diphenyl-3,5-heptanedione To a suspension of sodium hydride (60% in oil, 17 g) in dry cyclohexane (200 ml), a solution of 2,4-pentanedione (37 g, 0.37 mole) in dry cyclohexane was added dropwise at room temperature with stirring under nitrogen, and the resultant mixture was stirred for 40 min. at the same temperature. To this suspension, N,N,N',N'-tetramethylethylenediamine (91.8 g) was added dropwise, followed by the dropwise addition of n-butyllithium (1.6M in n-hexane solution, 337 g) at 0° C. or lower and the resultant mixture was stirred for 24 hours at room temperature. Then to this suspension, benzyl chloride (93.7 g) was added dropwise at 0°–5° C., stirring was continued for 2 hours at room temperature and allowed to stand overnight. The reaction mixture was poured into dilute hydrochloric acid. The organic layer was separated, washed thrice with $H_2O$, dried over anhydrous $MgSO_4$ and evaporated. The residue (79 g) was distilled under reduced pressure to give 23.5 g of the desired product as a pale yellow oil having a boiling point of 185°–190° C./0.4 mmHg.

(2) Synthesis of 4-diazo-1,7-diphenyl-3,5-heptanedione

To a solution of 1,7-diphenyl-3,5-heptanedione (16.6 g, 60 mmole) obtained in above (1) and piperidine (5.1 g, 60 mmole) in methylene chloride (120 ml), p-toluenesulfonylazide (12.4 g, 63 mmole) obtained in Synthesis Example 7, (1) was added dropwise at 0°–5° C., and stirring was continued for 2 hours at the same temperature. The reaction mixture was washed with dilute potassium hydroxide aqueous solution and $H_2O$, dried over anhydrous $MgSO_4$ and evaporated in vacuo. The resultant residue (19 g) was chromatographed on silica gel (Wakogel C-200, purchased from Wako Pure Chemical Industries, Ltd.) with methylene chloride as eluent to give 8.0 g of the desired product as a slightly yellow crystals having a melting point of 62.6°–64.0° C.

$^1$HNMR δppm($CDCl_3$): 2.93–3.08(8H, m, $CH_2$×4), 7.20 (10H, s, Aromatic×2).

IR(KBr-disk) vcm$^{-1}$: 2120,($CN_2$), 1650(C=O).

UV(MeCN)$\lambda_{MAX}$(log ε): 231.0 nm (4.28).

Anal. Calcd. for $C_{19} H_{18} N_2 O_2$: C%, 74.49, H%, 5.92, N%, 9.14.

Found: C%, 74.55, H%, 5.88 N%, 9.23.

SYNTHESIS EXAMPLE 10

Synthesis of 1-diazo-2-tetralone

To a solution of sodium ethoxide (4.68 g) in ethanol (150 ml), a solution of 2-tetralone (5.0 g, 34 mmole) in ethanol (10 ml) was added dropwise at 0° C., followed by the dropwise addition of p-toluenesulfonylazide (6.9 g, 35 mmole) obtained in Synthesis Example 7, (1), at −15° C.

The resultant mixture was poured into cold H$_2$O (350 ml), extracted with methylene chloride (250 ml×2), and the organic layer was washed with H$_2$O (200 ml), dried over anhydrous MgSO$_4$ and evaporated in vacuo. The resultant purplish-red crystals (5.2 g) were chromatographed on silica gel (Wakogel C-200) with n-hexane/methylene chloride [7/1→5/1→3/1 (v/v)] as eluent to give 2.3 g of the desired product as orange crystals having a melting point of 41.5°–43.5° C.

$^1$HNMR δppm(CDCl$_3$): 2.67(2H, t, J=6 Hz, 3-CH$_2$), 3.02 (2H, t, J=6 Hz, 4-CH$_2$), 6.96–7.29(4H, m, Aromatic)
IR(KBr-disk) vcm$^{-1}$: 2090 (CN$_2$), 1646(C=O).

SYNTHESIS EXAMPLE 11

Synthesis of 2-diazo-1,5-diphenyl-3-pentanone (1) Synthesis of 1,5-diphenyl-3-pentanone A solution of 1,5-diphenyl-1,4-pentadien-3-one (50.9 g, 0.217 mole) in dry tetrahydrofuran (350 ml) was hydrogenated over 5% palladium on carbon (5.6 g) at room temperature under an atmosphere of hydrogen. After reduction, catalyst was filtered off, the filtrate was concentrated and the residue was distilled under reduced pressure to give 25.5 g of the title compound as a pale yellow oil having a boiling point of 160°–162° C./0.4 mmHg.

$^1$HNMR δppm(CDCl$_3$): 2.65(4H, t, J=8 Hz, CH$_2$×2), 2.85 (4H, t, J=8 Hz, CH$_2$×2), 7.11–7.27(10H, m, Aromatic).
IR(Neat) vcm$^{-1}$: 1705 (C=O).

(2) Synthesis of 2-formyl-1,5-diphenyl-3-pentanone

To a suspension of sodium methoxide (6 g) in ethylether (80 ml), a mixture of 1,5-diphenyl-3-pentanone (24 g, 0.1 mole) obtained in above (1) and methyl formate (6.7 g, 0.11 mole) was added dropwise at 1°–2° C., stirring was continued for 1 hour at the same temperature and allowed to stand overnight at room temperature. The reaction mixture was poured into cold H$_2$O (300 ml), and aqueous layer was separated, acidified to ph 1 with 5% sulfuric acid and extracted with ethylether (100 ml×3). The organic layer was separated, washed with H$_2$O (100 ml×2), dried over anhydrous MgSO$_4$ and evaporated to give 12.7 g of the title compound as a pale yellow oil. The product was found to have keto-form and enol-form in molar ratio of ca. 1:1 based on $^1$HNMR.

1HNMR δppm(CDCl$_3$): 2.58(2H, t, J=5 Hz, CH$_2$), 2.79(2H, t, J=5 Hz, CH$_2$), 3.13(d, J=8 Hz, CH$_2$ CO—), 3.43(s, CH=C—), 3.77(t, J=8 Hz, CHCO—), 7.00–7.29(10H, m, Aromatic), 7.74(d, J=8 Hz, —CH—CHO), 9.55(s, CHO), 15.00(bs, OH).
IR(Neat) vcm$^{-1}$: 1700 (C=O), 1630(C=O).

(3) Synthesis of 2-diazo-1,5-diphenyl-3-pentanone

To a solution of 2-formyl-1,5-diphenyl-3-pentanone (12.2 g, 46 mmole) obtained in above (2) in methylene chloride (95 ml), triethylamine (8.5 g, 82 mmole) was added dropwise at 5° C. or lower, and then p-toluenesulfonylazide (9 g, 46 mmole) obtained in Synthesis Example 7, (1) was added dropwise at 10° C. or lower, and stirring was continued for 1.5 hours at 5°–10° C. The reaction mixture was washed with dilute potassium hydroxide aqueous solution and H$_2$O, dried over anhydrous MgSO$_4$ and evaporated in vacuo. The resultant orange oil (13.2 g) was chromatographed on silica gel [Wakogel C-200, purchased from Wako Pure Chemical Industries, Ltd.] with n-hexane/methylene chloride [7/1→4/1→2/1(v/v)] as eluent to give 9.6 g of the desired product as a pale yellow oil.

$^1$HNMR vppm(CDCl$_3$): 2.77(2H, t, J=8 Hz, CH$_2$), 2.98(2H, t, J=8 Hz, CH2), 3.63(2H, s, CH$_2$), 7.13–7.30(10H, m, Aromatic).
IR(Neat) vcm$^1$: 2060(CN$_2$), 1625(C=O).

SYNTHESIS EXAMPLE 12

Synthesis of 1,7-bis(4-tolyl)-4-diazo-3,5-heptanedione

Using p-methylbenzyl chloride (635.4 g) in place of benzyl chloride, described in Synthesis Example 9, (1), the reaction and treatment were carried out in the same manner as described in Synthesis Example 9, (1), (2) and (3), and the resultant oil was crystallized from ethanol to give 103 g of the title compound as slightly prisms having a melting point of 45.6°–46.8° C.

$^1$HNMR δppm(CDCl$_3$): 2.31(6H, s, CH$_3$×2), 2.88–3.05(8H, m, CH$_2$×4), 7.10(8H, s, Aromatic×2).
IR(KBr-disk) vcm$^{-1}$: 2100(CN$_2$), 1660(C=O).

SYNTHESIS EXAMPLE 13

Synthesis of 1,7-bis(4-methoxyphenyl)-4-diazo-3,5-heptanedione

Using p-methoxybenzyl chloride (133 g) in place of benzyl chloride, described in Synthesis Example 9, (1), the reaction and treatment were carried out in the same manner as described in Synthesis Example 9, (1), (2) and (3). The resultant oil was chromatographed on silica gel (Wakogel C-200) with methylene chloride as eluent to give 50.7 g of the desired product as a yellow viscous oil.

$^1$HNMR δppm(CDCl$_3$): 2.87–3.03(8H, m, CH$_7$×4), 3.78 (6H, s, CH$_3$×2), 6.82(4H, d, J=8.6 Hz, Aromatic(3-H, 5-H)×2), 7.13(4H, d, J=8.6 Hz, Aromatic(2-H, 6-H)×2).
IR(Neat) vcm$^{-1}$: 2900, 2100 (CN$_2$), 1650(C=O).

SYNTHESIS EXAMPLE 14

Synthesis of 2,2-bis(3-diazo-4-oxocyclohexyl) propane (1) Synthesis of 2,2-bis(4-oxocyclohexyl) propane To a solution of 2,2-bis(p-hydroxycyclohexyl)propane (12.1 g, 50 mmole) and pyridine (8.3 g, 0.11 mole) in dimethylsulfoxide (180 ml) and benzene (180 ml), dicyclohexylcarbodiimide (62 g, 0.30 mole) and then trifluoroacetic acid (6.3 g, 55 mmole) were added, and stirring was continued for 6 hours at room temperature. After standing for overnight at room temperature, H$_2$O (500 ml) was added to the reaction mixture, and extracted with ethyl acetate (200 Ml×2). The organic layer was washed with H$_2$O (500 ml×6), dried over anhydrous MgSO$_4$ and evaporated in vacuo. The residual crude solid (30 g) was purified by column chromatography [silica gel: Wakogel C-200; n-hexane/ethyl acetate (10/1→5/1) as eluent] to afford 5.5 g of the title compound as white crystals having a melting point of 163.0°–165.5° C.

$^1$HNMR δppm(CDCl$_3$): 0.86(6H, s, CH$_3$×2), 1.43–1.58(4H, m, cyclohexane ring), 1.74–1.86(2H, m, cyclohexane ring), 2.04–2.16(4H, m, cyclohexane ring), 2.25–2.47 (8H, m, cyclohexane ring CH$_2$).

(2) Synthesis of 2,2-bis(3-formyl-4-oxocyclohexyl)Propane

To a suspension of sodium methoxide (2.2 g, 40 mmole) in ethylether (30 ml), a mixture of 2,2-bis(4-oxocyclohexyl)-ropane (3.3 g, 18.2 mmole) and methyl formate (3.3 g, 54.6 mmole) was added dropwise at 0°–5° C. Stirring was continued for 2 hours at the same temperature, followed by stirring for 2 hours at room temperature. After standing for overnight at room temperature, H$_2$O (300 ml) was added to the reaction mixture. The aqueous layer was separated, acidified to pH 1-2 with conc. hydrochloric acid and extracted with ethyl acetate (150 ml×1). The organic layer was washed with H$_2$O (200 ml×3), dried over anhydrous MgSO$_4$ and evaporated in vacuo. The residue (4.5 g) was chromatographed on silica gel [Wakogel C-200 ] with n-hexane/ethyl acetate [10/1→5/1(v/v)] as eluent to afford 2.3 g of the desired product as a pale yellow oil.

HNMR δppm(CDCl$_3$): 0.88(6H, s, CH$_3$×2), 1.26–1.43(2H, m, cyclohexane ring), 1.58–1.72(2H, m, cyclohexane ring), 1.86–1.94(2H, m, cyclohexane ring), 2.03–2.18 (2H, m, cyclohexane ring), 2.28–2.50(6H, m, cyclohexane ring), 8.59(2H, d, J=5.5 Hz, cyclohexane ring CH×2), 14.32(2H, bs, CHO×2).

(3) Synthesis of 2,2-bis(3-diazo-4-oxocyclohexyl )propane

To a solution of 2,2-bis(3-formyl-4-oxocyclohexyl) propane (1.6 g, 5.4 mmole) and triethylamine (1.2 g, 12 mmole) in methylene chloride (60 ml), p-toluenesulfonyl azide (2.6 g, 13.2 mmole) obtained in Synthesis Example 7, (1) was added dropwise at 0°–5° C., and stirring was continued for 3 hours at the same temperature. The reaction mixture was poured into H$_2$O (200 ml), and extracted with methylene chloride (50 ml×3). The organic layer was washed with H$_2$O (150 ml×3), dried over anhydrous MgSO$_4$ and evaporated in vacuo. The residue was chromatographed on silica gel [Wakogel C-200 ] with n-hexane/ethyl acetate [10/1→5/1(v/v)] as eluent to afford 600 mg of the desired product as a pale yellow oil.

$^1$HNMR δppm(CDCl$_3$): 0.91(6H, t, J=5.5 Hz, CH$_3$×2), 1.41–1.57(2H, m, cyclohexane ring), 1.66–1.82(2H, m, cyclohexane ring), 1.92–1.98(2H, m, cyclohexane ring), 2.18–2.32(2H, m, cyclohexane ring), 2.48–2.68(6H, m, cyclohexane ring).

$^1$IR(Neat) δcm$^{-1}$: 3190, 3000, 2130(CN$_2$), 1620(C=O).

SYNTHESIS EXAMPLE 15

Synthesis of 5-diazo-2,2-dimethyl-1,3-dioxan-4,6-dione

To a solution of 2,2-dimethyl-1,3-dioxan-4,6-dione (11.6 g, 81 mmole) and triethylamine (8.4 g, 83 mmole) in ethanol (40 ml), p-toluenesulfonylazide (16 g, 18 mmole) obtained in the same manner as described in Synthesis Example 7, (1) was added dropwise at −15°—−10° C. Stirring was continued for 1 hour at the same temperature and the precipitate was filtered at −10° C., and the crude solid (wet, 15 g) was recrystallized from ethanol to give 8.5 g of the title compound as pale yellow crystals having a melting point of 93.0°–94.0° C.

$^1$HMNR δppm(CDCl$_3$): 1.79(6H, s, CH$_3$×2).
IR(KBr-disk) vcm$^{-1}$: 2165(CN$_2$), 1710(C=O).

SYNTHESIS EXAMPLE 16

Synthesis of 3-diazo-2,4-pentanedione

To a solution of 2,4-pentanedione (12 g, 120 mole) and triethylamine (12 g, 120 mmole) in ethylether (60 ml), p-toluenesulfonylazide (26 g, 130 mmole) obtained in the same manner as described in Synthesis Example 7, (1) was added dropwise at 0°–5° C., and stirring was continued for 1.5 hours at the same temperature. The reaction mixture was washed with H$_2$O (100 ml ×3), dried over anhydrous MgSO$_4$ and evaporated in vacuo. The residue was chromatographed on silica gel [Wakogel C-200 ] with n-hexane/methylene chloride [3/1→1/1→1/3(v/v)] as eluent to give 7.3 g of the title product as a pale yellow oil.

$^1$HNMR δppm(CDCl$_3$): 2.44(6H, s, CH$_3$×2).
IR(Neat) vcm$^{-1}$: 2110(CN$_2$), 1645(C=O).

SYNTHESIS EXAMPLE 17

Synthesis of 5-diazo-2-methyl-2-(2-phenethyl)-1,3-dioxan-4,6-dione (1) Synthesis of 2-methyl-2-(2-phenethyl)-1,3-dioxan-4,6-dione To a solution of malonic acid (56.7 g, 0.55 mmole) and acetic anhydride (73 ml, sulfuric acid (2 ml) was added dropwise at 5°–10° C. and stirring was continued for 20 min. at the same temperature. To this mixture, 4-phenyl-2-butanone (105 g, 0.7 mole) was added dropwise at 15°–20° C. and stirring was continued for 15 hours at the same temperature. The reaction mixture was taken up into H$_2$O, extracted with chloroform, then the organic layer was washed with H$_2$O, dried over anhydrous MgSO$_4$ and evaporated in vacuo. The resultant solid was recrystallized from aqueous acetone to give 68.0 g of the desired product as a white amorphous powder having a melting point of 63.0°–65.0° C.

$^1$HNMR δppm(CDCl$_3$): 1.74(3H, s, CH$_3$), 2.03–2.44(2H, m, CH$_2$), 2.60–3.02(2H, m, CH$_2$), 3.58(2H, s, COCH$_2$ CO), 7.16(5H, s, Aromatic).
IR(KBr-disk) vcm$^{-1}$: 1750(C=O).

(2) Synthesis of 5-diazo-2-methyl-2-(2-phenethyl)-1,3-dioxan-4,6-dione

To a solution of 2-methyl-2-(2-phenethyl)-1,3-dioxan-4,6-dione (67 g, 0.29 mole) obtained in above (1) and triethylamine (32 g) in ethanol (150 ml), p-toluenesulfonylazide (61 g, 0.3 mole) obtained in Synthesis Example 7, (1) was added dropwise at −15°—−10° C., and stirring was continued for 45 min. at the same temperature. The reaction mixture was extracted with methylene chloride. The organic layer was washed with H$_2$O, dried over anhydrous MgSO$_4$ and evaporated under reduced pressure. The resultant reddish residue was chromatographed on silica gel [Wakogel C-200 ] with n-hexane/ethyl acetate [10/1→5/1→3/1(v/v)] as eluent to give 44.0 g of the desired product as yellow crystals having a melting point of 50.5°–51.0° C.

$^1$HMNR δppm(CDCl$_3$): 1.74(3H, s, CH$_3$), 2.04–2.47(2H, m, CH$_2$), 2.60–3.02(2H, m, CH$_2$), 7.16(5H, s, Aromatic).
IR(KBr-disk) vcm$^{-1}$: 2180(CN$_2$), 1695(C=O).

EXAMPLE 1

A photoresist composition was prepared according to the following recipe and a pattern was formed in the manner described below:

| | |
|---|---|
| Poly[p-(1-methoxy-1-methylethoxy)styrene/ p-hydroxystyrene (the polymer of Synthesis Example 1) | 6.0 g |
| 3,8-Bis-diazo-2,4,7,9-decanetetraone (the photoacid generator of Synthesis Example 7) | 0.9 g |
| Diethylene glycol dimethyl ether | 13.1 g |

Figure 1B:
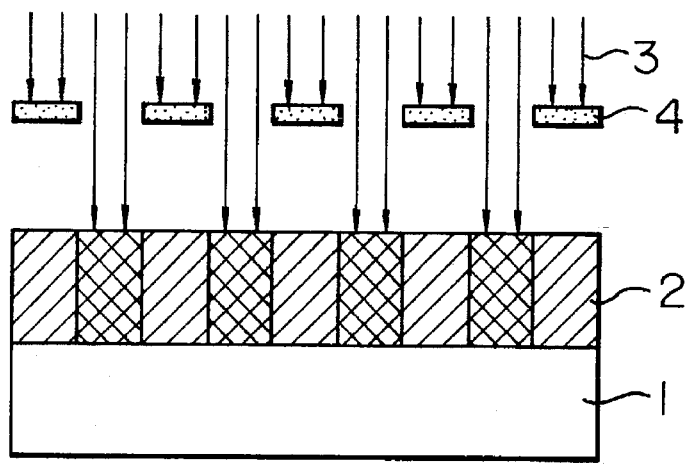
Figure 1C:
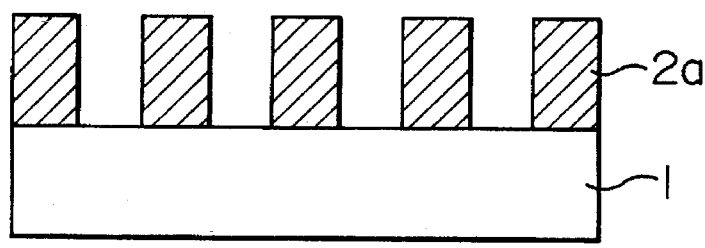

A pattern formation process using the above photoresist composition is explained below with reference to FIG. 1. The photoresist composition 2 was spin-coated on a semiconductor substrate 1 and soft-baked on a hot plate at 90° C. for 90 seconds to obtain a photoresist composition film of 1.0 μm in thickness (FIG. 1(a)). Then, the film was selectively exposed to KrF excimer laser beams 3 having a wavelength of 248.4 nm through a mask 4 (FIG. 1(b)). After baking on a hot plate at 110° C. for 90 seconds, the film was developed with an alkali developing solution (a 2.38% aqueous tetramethylammonium hydroxide solution) for 60 seconds to dissolve away only the exposed portion of the photoresist composition 2, whereby a positive pattern 2a was obtained (FIG. 1(c)).

The obtained positive pattern showed a resolution of 0.25 μm line-and-space. In this case, the exposure dose was about 45 mJ/cm². When PEB and the development were carried out after the lapse of 8 hours after the exposure using the photoresist composition, 0.25 μm line-and-space could be resolved without any trouble.

EXAMPLE 2 to 11

Photoresist compositions were prepared according to the respective recipes shown in Table 1, and pattern formation was carried out in the same manner as described in Example 1 except for using each photoresist composition thus prepared. The results obtained are shown in Table 2.

TABLE 1

| Example No. | Photoresist composition | |
|---|---|---|
| 2 | Poly[p-(1-methoxy-1-methylethoxy)-styrene/p-hydroxystyrene] (Polymer of Synthesis Example 2) | 6.0 g |
| | 3-Diazo-1-phenyl-2,4-pentanedione (Photoacid generator of Synthesis Example 8) | 1.5 g |
| | Diethylene glycol dimethyl ether | 12.5 g |
| 3 | Poly[p-(1-methoxy-1-methylethoxy)-styrene/p-hydroxystyrene] (Polymer of Synthesis Example 2) | 6.0 g |
| | 4-Diazo-1,7-diphenyl-3,5-heptanedione (Photoacid generator of Synthesis Example 9) | 1.5 g |
| | Diethylene glycol dimethyl ether | 12.5 g |
| 4 | Poly[p-(1-methoxy-1-methylethoxy)-styrene/p-hydroxystyrene] (Polymer of Synthesis Example 2) | 6.0 g |
| | 2,2-Bis(3-diazo-4-oxocyclohexyl)-propane (Photoacid generator of Synthesis Example 14) | 0.9 g |
| | Propylene glycol monomethyl ether acetate | 13.1 g |
| 5 | Poly[p-(1-trimethylsilyloxy-1-methylethoxy)styrene/p-hydroxystyrene] (Polymer of Synthesis Example 6) | 6.0 g |
| | 1,7-Bis(4-methoxyphenyl)-4-diazo-3,5-heptanedione (Photoacid generator of Synthesis Example 13) | 0.9 g |
| | 2-Hexanone | 13.1 g |
| 6 | Poly[p-(1-ethoxy-1-methylethoxy)-styrene/p-hydroxystyrene] (Polymer of Synthesis Example 3) | 6.0 g |
| | 1-Diazo-2-tetralone (Photoacid generator of Synthesis Example 10) | 0.9 g |
| | Methyl 3-methoxypropionate | 13.1 g |
| 7 | Poly[p-(1-methoxy-1-methylethoxy)-styrene/p-hydroxystyrene] (Polymer of Synthesis Example 2) | 6.0 g |
| | 5-Diazo-2,2-dimethyl-1,3-dioxan-4,6-dione (Photoacid generator of Synthesis Example 15) | 1.5 g |
| | Diethylene glycol dimethyl ether | 12.5 g |
| 8 | Poly[p-(1-benzyloxy-1-methylethoxy)styrene/p-hydroxystyrene] (Polymer of Synthesis Example 5) | 6.0 g |
| | 1,7-Bis(4-tolyl)-4-diazo-3,5-heptanedione (Photoacid generator of Synthesis Example 12) | 0.9 g |
| | Diethylene glycol dimethyl ether | 13.1 g |
| 9 | Poly[p-(1-methoxy-1-methyl-propoxy)styrene/p-hydroxystyrene] (Polymer of Synthesis Example 4) | 6.0 g |
| | 2-Diazo-1,5-diphenyl-3-pentanone (Photoacid generator of Synthesis | 0.9 g |

TABLE 1-continued

| Example No. | Photoresist composition | |
|---|---|---|
| | Example 11) | |
| | Methyl 3-methoxypropionate | 13.1 g |
| 10 | Poly[p-(1-methoxy-1-methylethoxy)-styrene/p-hydroxystyrene] (Polymer of Synthesis Example 1) | 6.0 g |
| | 3-Diazo-2,4-pentanedione (Photoacid generator of Synthesis Example 16) | 1.8 g |
| | Ethyl lactate | 12.2 g |
| 11 | Poly[p-(1-methoxy-1-methyl-propoxy)styrene/p-hydroxystyrene] (Polymer of Synthesis Example 4) | 6.0 g |
| | 5-Diazo-2-methyl-2-(2-phenethyl)-1,3-dioxan-4,6-dione (Photoacid generator of Synthesis Example 17) | 0.9 g |
| | Diethylene glycol dimethyl ether | 13.1 g |

TABLE 2

| | Exposure | Interval between exposure and PEB, and resolution | |
|---|---|---|---|
| Example No. | dose mJ/cm² | Immediately after exposure | After 8 hours |
| 2 | 50 | 0.25 μm Line-and-space | 0.25 μm Line-and-space |
| 3 | 50 | 0.30 μm Line-and-space | 0.30 μm Line-and-space |
| 4 | 40 | 0.30 μm Line-and-space | 0.30 μm Line-and-space |
| 5 | 70 | 0.30 μm Line-and-space | 0.30 μm Line-and-space |
| 6 | 50 | 0.25 μm Line-and-space | 0.25 μm Line-and-space |
| 7 | 35 | 0.25 μm Line-and-space | 0.25 μm Line-and-space |
| 8 | 60 | 0.30 μm Line-and-space | 0.30 μm Line-and-space |
| 9 | 50 | 0.30 μm Line-and-space | 0.30 μm Line-and-space |
| 10 | 45 | 0.30 μm Line-and-space | 0.30 μm Line-and-space |
| 11 | 45 | 0.30 μm Line-and-space | 0.30 μm Line-and-space |

As is clear from Table 2, the photoresist compositions of this invention had high resolution ability and were not deteriorated in resolution ability even when allowed to stand for a long period of time between the exposure to light and PEB.

COMPARATIVE EXAMPLE 1 to 3

Photoresist compositions were prepared according to the respective recipes shown in Table 3, and pattern formation was carried out in the same manner as described in Example 1 except for using each of said photoresist compositions. The results obtained are shown in Table 4.

Figure 2:
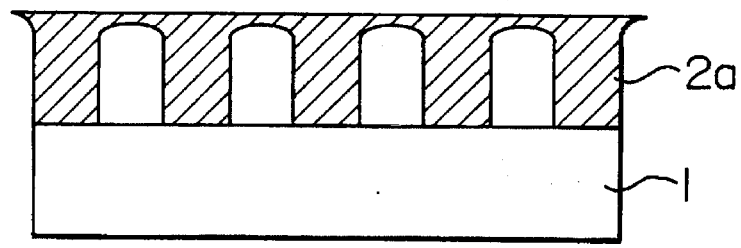
FIG. 2 is a cross-sectional view showing the impossibility of formation of a positive pattern by use of a conventional photoresist composition.

FIG. 2 shows a pattern result (the impossibility of pattern formation) obtained in Comparative Examples 1 to 3 when PEB and then the development were carried out after the lapse of 15 to 30 minutes after the exposure.

TABLE 3

| Comparative Example No. | Photoresist composition | |
|---|---|---|
| 1 | Poly(p-tert-butoxycarbonyloxystyrene/p-hydroxystyrene) | 6.0 g |
|   | Diphenyliodonium hexafluorophosphate | 0.3 g |
|   | Diethylene glycol dimethyl ether | 13.7 g |
| 2 | Poly(p-tert-butoxystyrene/p-hydroxystyrene) | 6.0 g |
|   | 2-Cyclohexylcarbonyl-2-(p-toluenesulfonyl)propane | 0.3 g |
|   | Diethylene glycol dimethyl ether | 13.7 g |
| 3 | Poly(p-tetrahydropyranyloxystyrene/p-hydroxystyrene) | 6.0 g |
|   | Diphenyliodonium hexafluorophosphate | 0.3 g |
|   | Diethylene glycol dimethyl ether | 13.7 g |

TABLE 4

| Comparative Example No. | Exposure dose mJ/cm² | Interval between exposure and PEB, and resolution | | |
|---|---|---|---|---|
| | | Immediately after exposure | After 15 min. | After 30 min. |
| 1 | 3 | 0.35 μm Line-and-space | No pattern was formed | |
| 2 | 30 | 0.35 μm Line-and-space | 0.35 μm Line-and-space | No pattern was formed |
| 3 | 3 | 0.35 μm Line-and-space | No pattern was formed | |

As is clear from the results shown in Table 4, the conventional photoresist compositions were inferior to the photoresist compositions of this invention in resolution. Even when they were allowed to stand for 15 minutes after the exposure, the dimensions of a pattern were changed, or pattern formation became impossible as shown in FIG. 2.

As is clear from the above, when the photoresist composition of this invention is used as a resist material for exposure to light having a wavelength of 300 nm or less, such as deep ultraviolet light (Deep UV), for example, KrF excimer laser beams (248.4 nm), there can easily be obtained a fine pattern which shows a very high resolution, permits stable maintenance of the dimensions of the pattern during a time delay between exposure and PEB, and has a good profile of practical quarter micron order. The photoacid generator used in the photoresist composition of this invention generates an acid upon exposure to light, and moreover it has a bleaching effect and hence has a buffering effect on the influence of standing waves which becomes marked with a shorter wavelength. Therefore, this invention is of great value in formation of an ultra-fine pattern in the semiconductor industry.

The photoresist composition of this invention are effective particularly in pattern formation using deep ultraviolet light or KrF excimer laser beams. They are sufficiently usable also for pattern formation using i-line light, electron beams, X-rays or the like.

What is claimed is:

1. A photoresist composition comprising a solution of (a) a difficulty alkali-soluble resin obtained by reacting isopropenyl alkyl ether, 2-alkoxy-1-butene, isopropenyl trimethylsilyl ether or isopropenyl benzyl ether with a resin having phenolic hydroxyl groups, said resin represented by the formula:

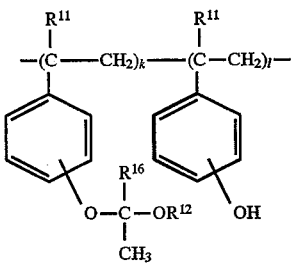

wherein $R^{11}$ is a hydrogen atom or a methyl group; $R^{16}$ is a methyl group or an ethyl group; $R^{12}$ is a linear, branched or cyclic alkyl group having 1 to 6 carbon atoms, a trimethylsilyl group or a benzyl group; k and l are independently a natural number ($0.1<k/(k+l)<0.7$); and the position of each substituent is the m-position or the p- position, or

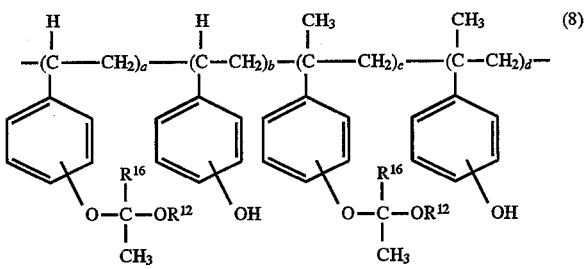

wherein $R^{12}$ and $R^{16}$ are as defined above; a, b, c and d are independently a natural number ($0.1<a/(a+b)<0.7$, $0.1<c/(c+d)<0.7$); and the position of each substituent is the m-position or the p-position, (b) a photosensitive compound which generates an acid consisting of a carboxylic acid upon exposure to light, and (c) a solvent capable of dissolving the components (a) and (b), whereby the resin (a) become alkali-soluble by the acid generated by exposure to light.

2. A photoresist composition according to claim 1, wherein said resin having phenolic hydroxy groups is a polyvinylphenol.

3. A photoresist composition according to claim 1, wherein said resin having phenolic hydroxy groups is a polyisopropenylphenol.

4. A photoresist composition according to claim 1, wherein said resin having phenolic hydroxy groups is a copolymer of vinylphenol and isopropenylphenol.

5. A photoresist composition according to claim 1, wherein the photosensitive compound (b) is a compound having in the molecule one or more diazodiketo groups (—CO—C(=N₂)—CO—) or one or more diazoketo groups (—CO—C (=N₂)—).

6. A photoresist composition according to claim 1, wherein the photosensitive compound (b) is a compound represented by the formula:

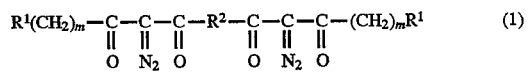

wherein $R^1$ is a hydrogen atom, a cycloalkyl group, a phenyl group, an alkyl-substituted phenyl group, or an alkoxy-substituted phenyl group; $R^2$ is —(O)$_p$—R$^3$O(O)$_p$—; $R^3$ is

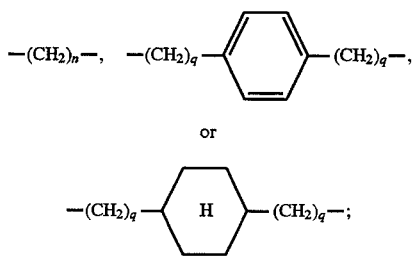

n is an integer of 1 to 5; q is zero or an integer of 1 to 5; p is zero or 1; and m is an integer of 1 to 5.

7. A photoresist composition according to claim 1, wherein the photosensitive compound (b) is a compound represented by the formula:

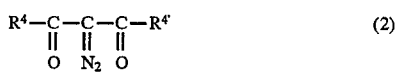

wherein $R^4$ and $R^{4'}$ are independently an alkyl group having 1 to 8 carbon atoms, or $R^5$—$(CH_2)_r$—; $R^5$ is a cycloalkyl group, a phenyl group, an alkyl-substituted phenyl group or an alkoxy-substituted phenyl group; $R^4$ and $R^{4'}$ may bind to each other to form a methylene chain; and r is zero or an integer of 1 to 5.

8. A photoresist composition according to claim 1, wherein the photosensitive compound (b) is a compound represented by the formula:

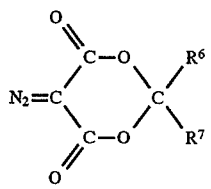

wherein $R^6$ and $R^7$ are independently an alkyl group having 1 to 10 carbon atoms, a benzyl group or a phenethyl group.

9. A photoresist composition according to claim 1, wherein the photosensitive compound which generates a carboxylic acid upon exposure to light is a compound represented by the formula:

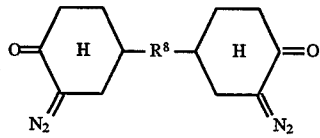

wherein $R^8$ is —$C(CH_3)_2$—, —$(O—CO)_z$—$R^9$—$(CO—O)_z$— or —$(CH_2)$—$R^{10}$—$(CH_2)_y$—; $R^9$ is —$(CH_2)_x$—; x is zero or an integer of 1 to 5; $R^{10}$ is a phenylene group or a cyclohexylene group; y is zero or an integer of 1 to 5; and z is zero or 1.

10. A photoresist composition according to claim 1, wherein the photosensitive compound (b) is a compound represented by the formula:

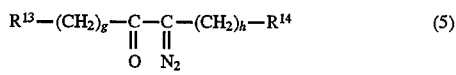

wherein $R^{13}$ and $R^{14}$ are independently a hydrogen atom, a phenyl group, an alkyl-substituted phenyl group or an alkoxy-substituted phenyl group; and g and h are independently an integer of 1 to 5.

11. A photoresist composition according to claim 1, wherein the photosensitive compound (b) is a compound represented by the formula:

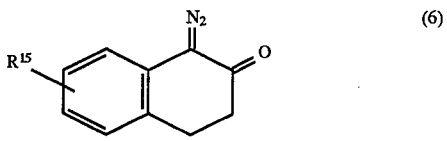

wherein $R^{15}$ is a hydrogen atom, an alkyl group or an alkoxy group.

12. A process for forming a positive pattern, which comprises forming on a substrate a film of the photoresist composition of claim 1, exposing the film selectively to actinic light, heating the exposed film, and developing the resulting film using an alkali developer to form the desired positive pattern.

13. A process according to claim 12, wherein the actinic light is deep ultraviolet light having a wave-length of 300 nm or less.

14. A process according to claim 12, wherein the actinic light is KrF excimer laser beams.

* * * * *